US008123858B2

(12) United States Patent
Wang et al.

(10) Patent No.: US 8,123,858 B2
(45) Date of Patent: Feb. 28, 2012

(54) MANUFACTURING METHOD OF SEMICONDUCTOR DEVICE AND SUBSTRATE PROCESSING APPARATUS

(75) Inventors: Jie Wang, Toyama (JP); Yasuhiro Ogawa, Toyama (JP); Katsuhiko Yamamoto, Toyama (JP); Takashi Yokogawa, Tonami (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1163 days.

(21) Appl. No.: 11/902,288

(22) Filed: Sep. 20, 2007

(65) Prior Publication Data
US 2008/0090389 A1 Apr. 17, 2008

(30) Foreign Application Priority Data

Sep. 28, 2006 (JP) ................. 2006-265510

(51) Int. Cl.
*C30B 21/02* (2006.01)
(52) U.S. Cl. ............... 117/89; 117/93; 117/94; 117/95; 117/96
(58) Field of Classification Search ............ 117/89, 117/93, 94, 95, 96
See application file for complete search history.

(56) References Cited

FOREIGN PATENT DOCUMENTS

| JP | A 4-184921 | 7/1992 |
| JP | A 7-153695 | 6/1995 |
| JP | A 8-330233 | 12/1996 |
| JP | A-2002-8994 | 1/2002 |
| JP | A 2006-59858 | 3/2006 |
| WO | WO 2006/049225 A1 | 5/2006 |

OTHER PUBLICATIONS

Wang, J. et al., "Low-temperature Pre-treatment in Vertical Epitaxial Reactor With Improved Vacuum Load-Lock Chamber," IEEE, pp. 134-135 (2006).
2006 International SiGe Technology and Device Meeting: Conference Digest of the Third International Silicon Germanium Technology and Device Meeting (ISTDM 2006), Princeton University, Princeton, N.J. (May 15-17, 2006).

*Primary Examiner* — Bob M Kunemund
(74) *Attorney, Agent, or Firm* — Oliff & Berridge, PLC

(57) ABSTRACT

To provide a manufacturing method of a semiconductor device, comprising: loading a substrate, with a silicon surface exposed at a part of the substrate, into a processing chamber; heating an inside of said processing chamber; performing pre-processing of supplying at least silane-based gas, halogen-based gas, and hydrogen gas into said processing chamber, removing at least a natural oxide film or a contaminated matter that exist on a surface of said silicon surface, and growing an epitaxial film on said silicon surface; and supplying gas containing at least silicon into said processing chamber after said pre-processing, and further growing the epitaxial film on said epitaxial film.

11 Claims, 5 Drawing Sheets

FIG. 3
| NO. | PRE-PROCESSING | OXYGEN CONCENTRATION($cm^{-3}$) | TEMPERATURE(°C) | $SiH_4$(sccm) | DCS(sccm) | $Cl_2$(sccm) | $H_2$(sccm) |
|---|---|---|---|---|---|---|---|
| 1 | NONE | 1.0E+20 | - | - | - | - | - |
| 2 | $H_2$ ANNEAL | 5.0E+17 | 800 | - | - | - | 1000 |
| 3 | DCS FLASH | 1.0E+19 | 600 | - | 50 | - | 1000 |
| 4 | $SiH_4$ FLASH | 2.0E+19 | 200 | 60 | - | - | 1000 |
| 5 | $Cl_2$ ETCHING | 2.0E+18 | 680 | - | - | 75 | 1000 |
| 6 | $SiH_4$ FLOW | 1.0E+19 | 200 to 440 | 60 | - | - | 1000 |
| 7 | $SiH_4/Cl_2$ FLOW | 6.0E+17 | 200 to 750 | 60 | - | 75 | 1000 |
FIG. 4A
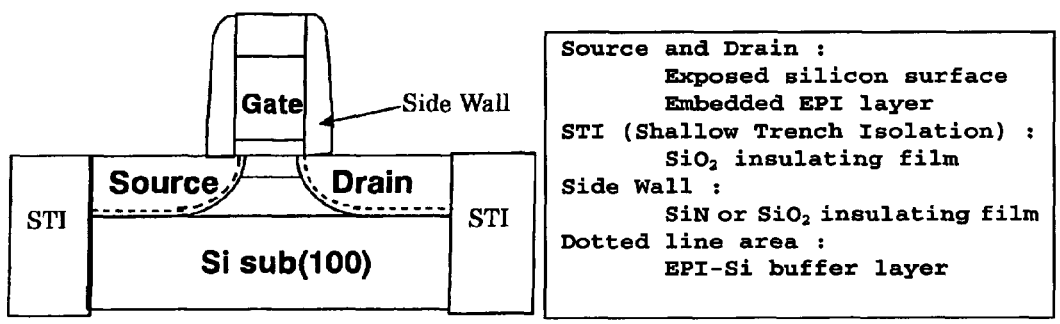
Recess-SD structure
FIG. 4B
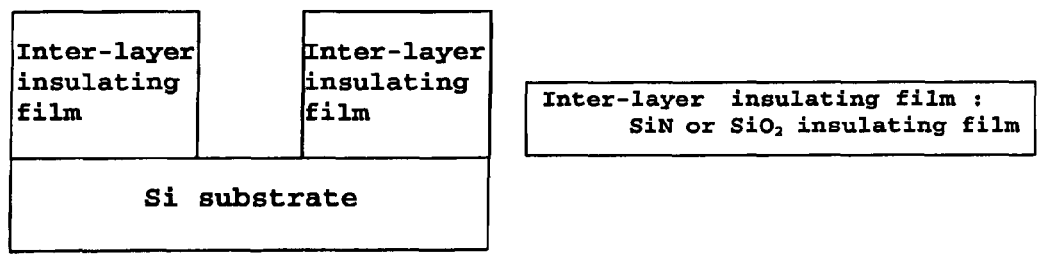
Contact structure Pre-processing temperature dependency by $Cl_2$ (10sccm), $SiH_4$ (40sccm), $H_2$ (1000sccm)

Processing sequence when EPI deposition step temperature is 500 to 750°C

EPI deposition step temperature > 620°C, when EPI-Si film growth during pre-processing is not preferable EPI deposition step temperature < 620°C, when EPI-Si film growth during pre-processing is preferable

MANUFACTURING METHOD OF SEMICONDUCTOR DEVICE AND SUBSTRATE PROCESSING APPARATUS

BACKGROUND

1. Technical Field

The present invention relates to a manufacturing method of a semiconductor device manufacturing the semiconductor device of an integrated circuit, etc, on a substrate, for processing a substrate such as a semiconductor silicon wafer, and a substrate processing apparatus, and particularly, relates to removing a natural oxide film and a contaminated matter such as an organic contamination on a substrate surface, and growing a good epitaxial film on the substrate surface, and further specifically relates to a technique of forming a high quality interface between a semiconductor substrate and the epitaxial film.

2. Background Art

In a silicon surface and a substrate having an insulating film such as a silicon nitride film, a technique of selectively growing a film only on a silicon surface is called a selective growth.

A finer MOSFET (Metal-Oxide-Semiconductor Field Effect Transistor) with higher performance has been progressed. However, as shown in FIG. 4A, source/drain of the MOSFET has problems such as lowering of a contact resistance and a growth of the epitaxial layer with defect density suppressed to minimum. A method of selectively growing a silicon epitaxial film on the source/drain is given as one of the methods of solving the aforementioned problems. A method of partially exposing an Si substrate between inter-layer insulating films, and selectively growing the silicon epitaxial film thereon, is given as a method of lowering the contact resistance, other than lowering of the contact resistance of the source/drain.

In recent years, in order to solve a problem such as increasing the natural oxide film at the time of introducing the substrate into a processing furnace or deterioration of a semiconductor due to adhesion of impurities, a vertical type pressure reducing CVD apparatus having an anterior chamber provided in the processing furnace is used. In this apparatus, a method of removing oxygen or moisture, etc, in the front chamber down to 1 ppm or less, and after nitrogen substitution, introducing the substrate into the processing furnace is used. An unprocessed substrate is transferred to a processing furnace anterior chamber from a substrate carrying port, and is set in a jig (boat) for substrate processing. The processing furnace anterior chamber is formed in a sealed structure possible to be evacuated, and by repeating evacuation and nitrogen-purging, the oxygen and the moisture are sufficiently removed, and thereafter, the substrate is introduced into the processing furnace. A drive axial part, a boat rotation mechanism part, and a wiring part for introducing the substrate and the jig for substrate processing are set in an inside of the processing furnace anterior chamber, thus involving a problem of contamination on the substrate surface due to an organic matter when evacuation is performed.

In addition, the processing furnace in the aforementioned apparatus has a double structure made up of an inner tube and an outer tube. Carrier gas and reactive gas are introduced from a furnace throat opening at a relatively low temperature, passes through the inner tube to process the substrate, then passes between the outer tube and the inner tube and is exhausted. This processing furnace has an advantage that by changing a diameter of the inner tube, a vapor phase reaction can be suppressed, thus facilitating a maintenance. However, there is a problem of contamination on the substrate surface due to the organic matter from the boat rotation mechanism part and an O-ring part.

The silicon substrate is loaded into the apparatus after pre-cleaning it by using dilute hydrofluoric acid, etc. However, the natural oxide film and the impurities on the substrate must be removed before the selective growth processing, after the substrate is introduced into the processing furnace.

When a semiconductor silicon wafer is exposed to atmospheric air, silicon on a wafer surface reacts with the oxygen in the atmospheric air, to form the natural oxide film with a thickness of about several Å. Such a natural oxide film acts not only as a defect element in a wiring step of an integrated circuit, but also as a cause of increasing the contact resistance, which causes an obstacle to the operation speed and reliability of the integrated circuit.

Conventionally, in order to remove this natural oxide film, the wafer must be subjected to annealing process by flowing hydrogen gas at a high temperature (about 800° C.). However, problems such as thermal damage to a substrate element and increase of thermal budget have been more serious. Therefore, the temperature of the substrate processing needs to be decreased, thus requiring a method of removing the natural oxide film instead of a hydrogen annealing process at a high temperature, which is a conventional art.

SUMMARY OF THE INVENTION

In order to solve a problem involved in a method of removing a natural oxide film which has been performed at a high temperature, an object of the present invention is to provide a manufacturing method of a semiconductor device and a substrate processing apparatus capable of removing a contaminated matter such as the natural oxide film or an organic matter at a low temperature.

According to an aspect of the present invention, there is provided a manufacturing method of a semiconductor device, comprising:

loading a substrate, with a silicon surface partially exposed, to an inside of a processing chamber;

heating an inside of said processing chamber;

supplying at least silane-based gas, halogen-based gas, and hydrogen gas to the inside of said processing chamber, thereby removing at least a natural oxide film or a contaminated matter that exists on a surface of said silicon surface, and making an epitaxial film grow on said silicon surface; and supplying gas containing at least silicon to the inside of said processing chamber, and making the epitaxial film further grow on said epitaxial film.

According to the present invention, the contaminated matter such as the natural oxide film or the organic matter can be removed at a low temperature.

BRIEF DESCRIPTION OF THE DRAWINGS

FIG. 3 is a view showing a condition of pre-processing and a measurement result of an oxygen concentration of an interface.

FIG. 4 is an outlined sectional view showing a constitutional example of a semiconductor device to which the present invention is applied.

DESCRIPTION OF PREFERRED
EMBODIMENTS OF THE INVENTION

Preferred embodiments of the present invention will be explained based on the drawings.

[Outlined Structure of a Processing Furnace and its Periphery]

Figure 1:
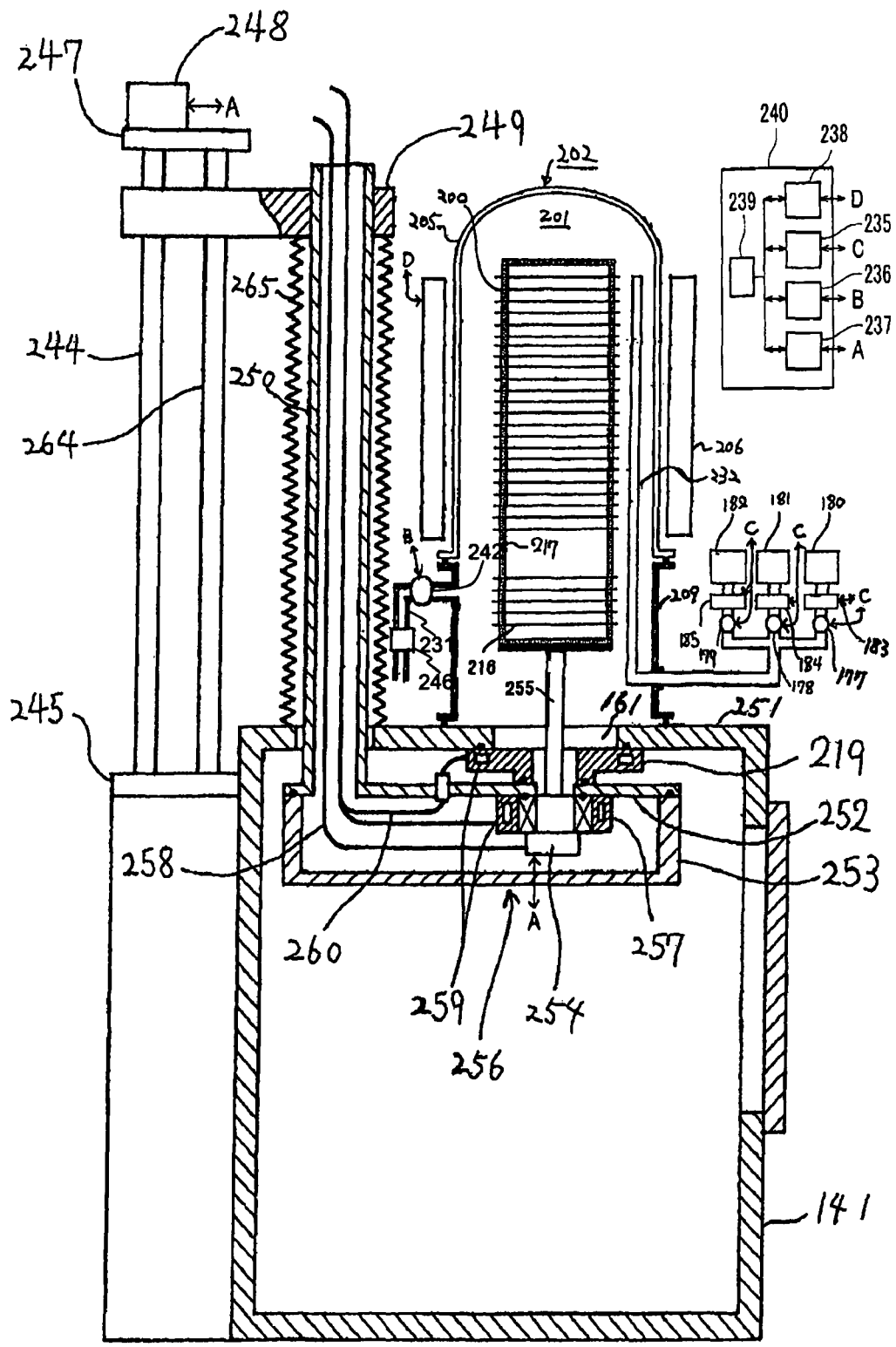
FIG. 1 is an outlined sectional view showing a processing furnace of a substrate processing apparatus according to a preferred example of the present invention.

FIG. 1 is an outlined block diagram of a processing furnace 202 and a periphery of the processing furnace of a substrate processing apparatus suitably used in the embodiments of the present invention.

<Processing Furnace>

As shown in FIG. 1, the processing furnace 202 has a heater 206. The heater 206 has a cylindrical shape and is constituted of a heater element and a heat insulating member provided in its circumference, and is supported by a holding member so as to be vertically installed.

In an inside of the heater 206, an outer tube 205 as a reaction tube is disposed concentrically with the heater 206. The outer tube 205 is composed of a heat-resistant material such as quartz ($SiO_2$) or silicon carbide (SiC), formed in a cylindrical shape, with an upper end closed and a lower end opened. A processing chamber 201 is formed in a cylinder hollow part in the inside of the outer tube 205, so that wafers 200 as substrates can be housed in a state of being vertically arranged in multi-stages in a horizontal posture by a boat 217 as will be described later.

A manifold 209 is disposed in a lower part of the outer tube 205, concentrically with the outer tube 205. The manifold 209 is composed of stainless, etc, for example, and is formed in a cylinder shape, with an upper end and a lower end opened. This manifold 209 is provided so as to support the outer tube 205. In addition, an O-ring as a sealing member is provided between the manifold 209 and the outer tube 205. By supporting this manifold 209 by the holding member not shown, the outer tube 205 is in a state of being vertically installed. A reaction vessel is formed by these outer tube 205 and manifold 209.

In the manifold 209, a gas exhaust tube 231 is provided and also a gas supply tube 232 is provided so as to pass through. The gas supply tube 232 is divided into three on an upper stream side, and is connected to valves 177, 178, 179, and a first gas supply source 180, a second gas supply source 181, and a third gas supply source 182, via MFC 183, 184, 185 as a gas flow controller. A gas flow controller 235 is electrically connected to the MFC 183, 184, 185 and the valves 177, 178, 179, so as to control a flow rate, at a desired timing to obtain a desired gas flow rate to be supplied. A vacuum exhaust device 246 such as a vacuum pump is connected to a lower stream side of the gas exhaust tube 231, via a pressure sensor as a pressure detector not shown and a pressure adjuster (APC valve) 242 as a pressure adjuster. A pressure controller 236 is electrically connected to the pressure sensor and the APC valve 242, and the pressure controller 236 controls a pressure in the processing chamber 201 to set at a desired pressure by adjusting an opening degree of the APC valve 242 based on the pressure detected by the pressure sensor.

A seal cap 219 as a furnace opening lid member for air-tightly closing a lower end opening of the manifold 209 is provided in a lower part of the manifold 209. The seal cap 219 is composed of metal such as stainless, and is formed in a disc shape. The O-ring is provided on an upper surface of the seal cap 219, as a sealing member that abuts on a lower end of the manifold 209. A rotation mechanism 254 is provided in the seal cap 219. A rotary shaft 255 of the rotation mechanism 254 is passed through the seal cap 219 and is connected to a boat 217 as will be described later, so as to rotate the wafer 200 by rotating the boat 217. The seal cap 219 is constituted to be vertically elevated by an elevating motor 248 as will be described later as an elevation mechanism provided outside the processing furnace 202, thus making it possible to load the boat 217 into/from the processing chamber 201. A drive controller 237 is electrically connected to the rotation mechanism 254 and the elevating motor 248, to control an operation so that a desired operation is performed at a desired timing.

The boat 217 as a substrate holding tool is composed of a heat-resistant material such as quartz or silicon carbide, and is constituted to hold a plurality of wafers 200 in horizontal postures arranged in multi-stages, with a center aligned with one another. A plurality of heat insulating plates 216 are arranged in multi-stages in horizontal postures in a lower part of the boat 217, as a heat insulating member formed in a disc shape composed of the heat-resistant material such as quartz and silicon carbide, thus making it difficult for the heat emitted from the heater 206 to be transmitted to the manifold 209 side.

A temperature sensor (not shown) is provided near the heater 206, as a temperature detecting member for detecting the temperature inside the processing chamber 201. A temperature controller 238 is electrically connected to the heater 206 and the temperature sensor, and the temperature inside the processing chamber 201 is controlled at a desired timing so as to obtain a desired temperature distribution, by adjusting a power supply condition to the heater 206 based on temperature information detected by the temperature sensor.

In the structure of this processing furnace 202, a first processing gas is supplied from the first gas supply source 180 and is introduced to the inside of the processing chamber 201 via the valve 177 by the gas supply tube 232 after its flow rate is adjusted by the MFC 183. A second processing gas is supplied from the second gas supply source 181 and is introduced to the inside of the processing chamber 201 by the gas supply tube 232 via the valve 178 after its flow rate is adjusted by the MFC 184. A third processing gas is supplied from the third gas supply source 182 and is introduced to the inside of the processing chamber 201 by the gas supply tube 232 via the valve 179 after its flow rate is adjusted by the MFC 185. In addition, the gas in the processing chamber 201 is exhausted from the processing chamber 201 by the vacuum exhaust device 246 as an exhaust device connected to the gas exhaust tube 231.

(Outlined Structure of the Periphery of the Processing Furnace)

Next, the structure of the periphery of the processing furnace of the substrate processing apparatus used in the present invention will be explained.

A lower substrate 245 is provided on an outer surface of a load lock chamber 141 as the anterior chamber. A guide shaft 264 engaged with an elevating base 249 and a ball screw shaft 244 screwed into the elevating base 249 are provided on the lower substrate 245. An upper substrate 247 is provided on an upper end of the guide shaft 264 installed upright on the lower substrate 245 and the ball screw shaft 244. The ball screw shaft 244 is rotated by the elevating motor 248 provided on the upper substrate 247. By a rotation of the ball screw shaft 244, the elevating base 249 is elevated.

A hollow elevating shaft 250 is vertically provided on the elevating base 249, and a connection part of the elevating base 249 and the elevating shaft 250 is set in an air-tight state. The elevating shaft 250 is elevated along with the elevating base 249. The elevating shaft 250 loosely penetrates a top plate 251 of the load lock chamber 141. A through hole of the top plate 251 through which the elevating shaft 250 penetrates has a sufficient margin to prevent the top plate 250 from being brought into contact with the elevating shaft 250. A bellows 265 is provided between the load lock chamber 141 and the elevating base 249, to air-tightly maintain the load lock chamber 141, as a hollow stretching body having stretchability capable of covering a circumference of the elevating shaft 250. The bellows 265 has a sufficient stretching amount capable of responding to an elevation amount of the elevating base 249, and an inner diameter of the bellows 265 is sufficiently larger than an outer shape of the elevating shaft 250, to prevent the bellows 265 from being brought into contact with the elevating shaft 250 by stretching of the bellows 265.

An elevating shaft 250 is horizontally fixed to the lower end of the elevating shaft 250. A drive part cover 253 is air-tightly attached to the lower surface of the elevating substrate 252, via a sealing member such as an O-ring. The elevating substrate 252 and the driving part cover 253 constitute a driving part housing case 256. With this structure, an inside of the driving part housing case 256 is isolated from an atmosphere in the load lock chamber 141.

In addition, the rotation mechanism 254 of the boat 217 is provided in the inside of the driving part housing case 256, and a circumference of the rotation mechanism 254 is cooled by a cooling mechanism 257.

A power supply cable 258 is guided by the rotation mechanism 254 and is connected thereto from the upper end of the elevating shaft 250, passing through a hollow part of the elevating shaft 250. In addition, a cooling flow path 259 is formed in a cooling mechanism 257 and the seal cap 219, and a cooling water pipe 260 for supplying cooling water is connected to the cooling flow path 259, passing through the hollow part of the elevating shaft 250 from the upper end of the elevating shaft 250.

By driving the elevating motor 248, thereby rotating the ball screw shaft 244, the drive part housing case 256 is elevated via the elevating base 249 and the elevating shaft 250.

By elevating the driving part housing case 256, a furnace opening 161 of the processing furnace 202 is closed by the seal cap 219 air-tightly provided in the elevating substrate 252, thus making a state possible to process the wafer. By lowering the driving part housing case 256, the boat 217 is lowered together with the seal cap 219, thus making a state possible to unload the wafer 200 to outside.

The gas flow controller 235, pressure controller 236, drive controller 237, and temperature controller 238 also constitute an operation part and an input/output part, and are electrically connected to a main controller 239 that controls an entire body of the substrate processing apparatus. These gas flow controller 235, pressure controller 236, drive controller 237, temperature controller 238, and main controller 239 are constituted as a controller 240.

[Explanation for an Example of an Epitaxial Deposition Method Including Pre-Processing Using the Processing Furnace]

Next, explanation will be given to an example of a method of forming an epitaxial Si film (EPI-Si film) on the substrate such as a silicon wafer 200 by using the processing furnace 202 of the aforementioned structure, as one step of the manufacturing step of the semiconductor device. Note that in the explanation given hereunder, the operation of each part constituting the substrate processing apparatus is controlled by the controller 240.

First, the natural oxide film on a silicon wafer surface is removed by using dilute hydrofluoric acid, hydrogen termination of the surface is simultaneously performed, and thereafter the wafer 200 is set on the boat 217 in the load lock chamber 141 of the processing furnace 202.

When a plurality of wafers 200 are charged into the boat 217 (wafer charge), as shown in FIG. 1, the boat 217 holding the plurality of wafers 200 is loaded into the processing chamber 201 by an elevating operation of the elevating base 249 and the elevating shaft 250 by the elevating motor 248 (boat loading). In this state, the lower end of the manifold 209 is sealed by the seal cap 219 via the O-ring.

<Heating>

The inside of the processing chamber 201 is vacuum-exhausted by a vacuum-exhaust apparatus 246, so as to be a desired pressure (vacuum state). At this time, the pressure in the processing chamber 201 is measured by a pressure sensor, and based on the pressure thus measured, the APC valve 242 is feedback-controlled. In addition, the inside of the processing chamber 201 is heated by the heater 206 so as to be a desired temperature (deposition temperature). At this time, based on the temperature information detected by the temperature sensor to obtain a desired temperature distribution in the processing chamber 201, the power supply condition to the heater 206 is feedback-controlled. Subsequently, by the rotation mechanism 254, the wafer 200 is rotated by rotation of the boat 217.

<Supply and Exhaust of Gas>

Silane-based gas ($SiH_4$ or $Si_2H_6$), chlorine gas ($Cl_2$), and hydrogen gas ($H_2$) are supplied from the first gas supply source 180, the second gas supply source 181, and the third gas supply source 182, respectively as processing gas. After opening degrees of the MFC 183, 184, 185 is adjusted to obtain a desired flow rate, the valves 176, 177, 178 are opened and each processing gas flows through the gas supply tube 232 and is introduced into the processing chamber 201 from an upper part of the processing chamber 201. The introduced gas passes through the processing chamber 201 and is exhausted from the gas exhaust tube 231.

<Pre-Processing>

Here, pre-processing of the surface of the wafer 200 and in-furnace temperature adjustment are performed in parallel. The in-furnace temperature adjustment includes a temperature increasing stage from the temperature for inserting the wafer 200 into the processing chamber 201 to the temperature for deposition, and the stage in which the inside of the processing chamber 201 and the wafer 200 are stabilized at this deposition temperature. In the pre-processing, the silane-based gas, the chlorine gas, and the hydrogen gas are mixed and used. By performing the pre-processing, oxygen/carbon density at the interface of the surface of the wafer 200 can be reduced, thus making it possible to form a high quality interface between the wafer 200 and a deposited film.

<Epitaxial Deposition>

When the pre-processing is completed and the temperature is stabilized at the deposition temperature, the processing is immediately moved to an epitaxial deposition step. Note that after the pre-processing is ended, residual gas in the processing furnace is removed by carrier gas such as hydrogen as needed, and thereafter the processing is moved to deposition processing. Hydrogen gas is constantly flown into the processing furnace to prevent the contamination due to a reversal-diffusion from an exhaust system.

<Processing Condition>

Note that for example, processing conditions for processing the wafer in the processing furnace of this embodiment includes: the temperature for introducing the wafer into the processing furnace set at 200° C. to deposition temperature or less; appropriate temperature of the pre-processing set at 200 to 750° C., a deposition processing temperature set at 500 to 750° C., a processing pressure set at 1 to 5000 Pa, gas species and gas supply flow rate set at $SiH_4$:10 to 500, $Cl_2$:10 to 500, and $H_2$:100 to 20000 sccm. The wafer is processed by maintaining each processing condition constant at a certain value within each range.

As an example, the deposition is performed at the deposition temperature of 680° C., $SiH_4$ of 250 sccm, $Cl_2$ of 75 sccm, $H_2$ of 1000 sccm, and the processing pressure of 10 Pa.

<Pressure is Returned to Normal Pressure>

When a previously set time is elapsed, inert gas is supplied from an inert gas supply source not shown, and the inside of the processing chamber 201 is substituted with the inert gas, and the pressure in the processing chamber 201 is returned to the normal pressure.

<Unloading>

Thereafter, the seal cap 219 is lowered by the elevating motor 248, the lower end of the manifold 209 is opened, and the an already processed wafer 200 is unloaded to outside from the lower end of the manifold 209 in a state of being held by the boat 217 (boat unloading). Thereafter, the already processed wafer 200 is taken out from the boat 217 (wafer discharge).

[Reason Why the Contaminated Matter is Removed in the Pre-Processing]

Next, explanation will be given to the pre-processing of removing the contaminated matter such as the natural oxide film and the organic matter on the surface of the wafer 200.

<Pre-Processing Conditions of the Embodiment by Using $SiH_4$, $Cl_2$, and $H_2$>

According to the embodiment of the present invention, in the pre-processing, $SiH_4$ gas, $Cl_2$ gas, and $H_2$ gas are supplied into the processing chamber 201, and each gas flow rate is set, so that the $SiH_4$ gas is 60 sccm, the $Cl_2$ gas is 75 sccm, and the $H_2$ gas is 1000 sccm. At this time, the pressure in the processing chamber 201 is 10 Pa.

In addition, the pre-processing is executed in a process in which the temperature of the wafer 200 and the inside of the processing chamber 201 is increased from the temperature of inserting the wafer 200 into the processing chamber 201 (such as 200° C.) to the deposition temperature (such as 680° C.). Note that the pre-processing may also be executed in a state of stabilizing the temperature in the wafer 200 and the processing chamber 201 to the deposition temperature after the temperature is increased.

<Mechanism for Creating a Clean Silicon Surface>

Here, a mechanism of removing a residual oxide film on the surface of the wafer 200, being the pre-processing, and creating a clean silicon surface will be explained.

(Role of $SiH_4$ and $Cl_2$)

After processing such as cleaning by dilute hydrofluoric acid, rinsing by pure water, and drying is applied to the wafer 200, the hydrogen termination is formed on the silicon surface of the wafer 200, and the oxidization of the silicon surface is delayed. However, in this state also, adsorbed moisture and the natural oxide film are partially remained on the surface.

Here, when the pre-processing step is not performed, when the wafer 200 is inserted into the processing chamber 201, the hydrogen termination on the surface is desorbed in the vicinity of 450 to 500° C. by a temperature increase of the wafer, and unprotected silicon surface is exposed. Then, oxygen and moisture molecules remained in the processing chamber 201 are adsorbed on the silicon surface, and one layer or not more than one layer of natural oxide film is formed on the surface.

Meanwhile, when the pre-processing is performed, the wafer 200 is inserted into the processing chamber 201, with the temperature in the processing chamber 201 set low at 200° C., and before the hydrogen termination of the surface of the wafer 200 is desorbed (below 450 to 500° C.), mixed gas of $SiH_4$, $Cl_2$, and $H_2$ is immediately flown, thus removing or largely reducing residual oxygen and moisture amount in the furnace by using significantly high reactivity of $SiH_4$ molecules and moisture, oxygen. Thus, it is possible to prevent the oxygen and moisture molecules from being adsorbed on silicon atoms on the surface of the wafer 200. Simultaneously, by utilizing the etching effect of silicon by the $Cl_2$ gas, the residual natural oxide film is removed together with the etched silicon on the outermost surface.

Namely, in the pre-processing used in this embodiment, a composite removal is performed by two elements such as a removal of residual oxygen and moisture in the furnace or a significant reduction of them, and etching of the silicon atoms on the outermost surface. Thus, more efficient and excellent removal is performed.

(Role of $H_2$)

Note that reactivity of $Cl_2$ supplied in the pre-processing is high, and there is a tendency of strengthening an etching action in the wafer 200 on an upper stream side of the gas in the processing chamber 201 or in a peripheral part of the wafer 200.

However, in the pre-processing, $H_2$ is also simultaneously supplied together with $Cl_2$, and therefore HCl or its intermediate product is produced by the reaction of $Cl_2$ and $H_2$. The HCl or the intermediate product has a lower reactivity than $Cl_2$, and therefore uniform etching is performed in the wafer 200 on the lower stream side in the processing chamber 201 or in-surface of the wafer 200, and it is possible to expect improvement in uniformity of etching.

In addition, the following advantage is also expected by simultaneously supplying $H_2$ in the pre-processing. Namely, sealability is maintained between the processing chamber 201 and an external atmosphere by a sealing member such as the O-ring. However, it can not be denied that the external atmosphere is mixed into the processing chamber 201. Even if an atmosphere containing moisture, etc, is mixed into the processing chamber 201 from outside and the surface of the wafer 200 is oxidized, a reducing action is accelerated by $H_2$ supplied into the processing chamber 201, thus making it possible to maintain the surface of the wafer 200 clean.

(Reason for Executing in a Temperature Increase Process)

In addition, in the pre-processing in this embodiment, the pre-processing is started to be performed in the temperature increase process (the temperature increase process from 200° C. to 500° C.) in the wafer 200 and the processing chamber 201, and the reason therefore is as follows.

Before the wafer 200 is put in the furnace at a low temperature of 200° C. and the hydrogen termination of the surface of the wafer 200 is desorbed, the mixed gas of $SiH_4$, $Cl_2$, and $H_2$ is immediately flown, thus removing or significantly reducing the residual oxygen and moisture amount in the furnace. Thus, as described above, adsorption on the silicon atoms on the surface and oxidization are prevented simultaneously by etching action of the silicon by $Cl_2$ gas, and the residual natural oxide film on the outermost surface is removed together with the etched silicon on the outermost surface.

Here, when the wafer 200 is put in the furnace and the mixed gas of $SiH_4$, $Cl_2$, and $H_2$ is flown at 500° C. or more, the silicon, from which the hydrogen termination of the surface of the wafer 200 is disorbed, is adsorbed and oxidized by the residual oxygen and moisture in the reaction vessel for an extremely short period of time. Although $Cl_2$ gas has an etching capability to the silicon, $SiO_2$ is hardly etched by $Cl_2$ gas after reacting with the wafer surface once. Therefore, the removal of the residual natural oxide film is facilitated by executing the pre-processing in the temperature increase process in a relatively low temperature state. In addition, the pre-processing and temperature increase are simultaneously performed, and therefore the throughput can be improved.

<Measurement Result of Interface Oxygen Concentration Compared with Other Pre-Processing>

FIG. 3 shows a measurement result of an interface oxygen concentration between a film deposited on the substrate surface after executing the pre-processing and the substrate surface.

In FIG. 3, the pre-processing shown in No. 7 is a pre-processing condition in this embodiment, and this reveals that when an epitaxial growth occurs after executing the pre-processing by $SiH_4+Cl_2+H_2$ at 200 to 750° C., the interface oxygen concentration between the silicon substrate and the silicon epitaxial film measured by an SIMS (Secondary Ionization Mass Spectrometer) is $6E17$ atoms/cm$^3$.

In addition, for comparison, No. 1 shows a case of not executing the pre-processing, and No. 2 shows a conventional measurement result in the pre-processing by $H_2$ annealing at 800° C. From this result, it is found that irrespective of a low temperature in the pre-processing of this embodiment, the interface oxygen concentration of the same level as the $H_2$ annealing (No. 2) at 800° C. can be obtained.

Also, as a reference, No. 3 to No. 6 of FIG. 3 show the measurement result in a case of performing the pre-processing by other method. However, a more excellent result can be obtained in the pre-processing (No. 7) of this embodiment than in any one of the aforementioned methods.

[Epitaxial Growth During the Pre-Processing]

The pre-processing in this embodiment is executed, in the temperature increase process while stabilizing the temperature, with the temperature of the wafer 200 and inside of the processing chamber 201 set in a pre-processing temperature range from 200 to 750° C. A relation between the pre-processing temperature and a growth of the epitaxial film during pre-processing will be described hereunder.

<Growing Speed of the Epitaxial Film and a Poly-Si Film in this Embodiment>

Figure 5:
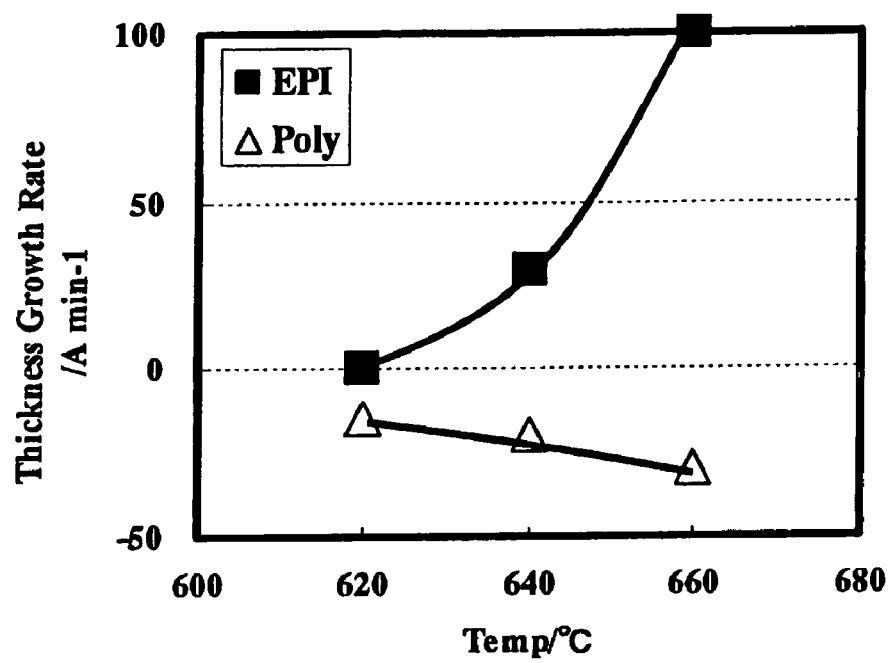
FIG. 5 is a view showing a temperature dependency of an epitaxial film and a poly-silicon film in the pre-processing.

$SiH_4$, $Cl_2$, $H_2$ are simultaneously supplied into the furnace to perform the pre-processing step, while increasing the temperature in the processing chamber in each case of 200° C. to 620° C., 200° C. to 660° C., and 200° C. to 680° C., and a result of examining a growing speed of an EPI-Si film and a Poly-Si film is shown in FIG. 5. It is found that phenomena of the EPI-Si film growth and Poly-Si film etching are simultaneously generated during the pre-processing. By etching the Poly-Si film, the Poly-Si film can not be deposited on an insulating film other than a silicon opening part, and the EPI-Si growth during the pre-processing occurs selectively in an opening part of an exposed silicon substrate.

The EPI-Si film growth is approximately close to zero at 620° C. Meanwhile, an etching speed of the Poly-Si film, which is an index of etching of the surface silicon to remove the surface residual oxygen, is increased. As the processing temperature is increased, the EPI-Si film growth speed is significantly increased together with the temperature increase.

(A Case that the Epitaxial Growth is not Preferable/a Case that the Epitaxial Growth is Preferable)

Here, when the EPI-Si film growth is not preferable during the pre-processing in the substrate, with the silicon surface exposed at a part of the substrate, pre-processing mixed gas is switched to only hydrogen gas at the time point of 620° C., thus making it possible to suppress improper EPI-Si film growth and also remove the residual oxygen on the surface and contaminated matters.

In addition, when the EPI-Si film growth is not preferable during the pre-processing in the substrate, with the silicon surface exposed at a part of the substrate, the pre-processing mixed gas may be continued to be supplied even when the temperature reaches 620° C. or more. The film thickness of the EPI-Si film growth during the pre-processing can be controlled by the temperature and a pre-processing duration time.

(A Specific Example when There is No Adverse Effect on the Epitaxial Growth)

Note that the following (1) and (2) can be given as a rather preferable case, having no adverse effect on the EPI-Si film growth that occurs at an opening part of an exposed substrate during the pre-processing.

(1) A case that the aforementioned EPI-SiGe is performed after forming a buffer layer (several nm to 100 nm) of the EPI-Si film on the surface of the opening part of the Si substrate, to reduce a surface roughness and a defect in the aforementioned EPI-SiGe film in a recess-source/drain structure of FIG. 4(A) by forming an EPI-SiGe (silicon germanium) film.

(2) A case of selectively growing the EPI of contact for the purpose of decreasing a contact resistance in a contact structure of FIG. 4(B). In this case, by selectively growing the EPI during the pre-processing, productivity of the EPI growth can be improved.

[Explanation for the Pre-Processing of the Embodiment and an Epitaxial Film-Forming Test Thereafter]

Next, the pre-processing and an EPI film forming sequence will be explained with reference to FIG. 6.

Figure 6A:
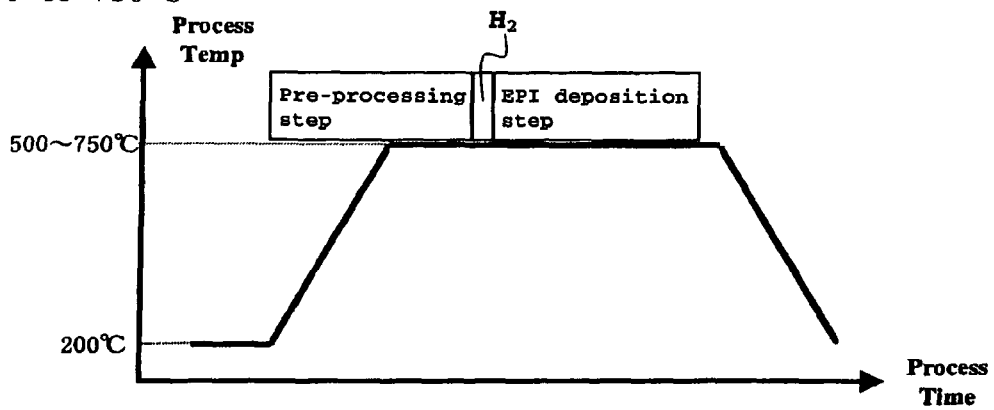
FIG. 6 is a view showing a processing sequence according to a preferred example.
Figure 6B:
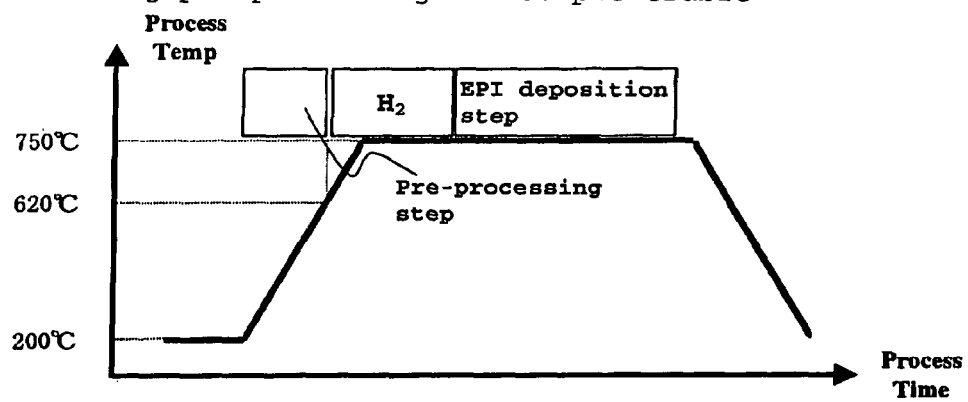
Figure 6C:
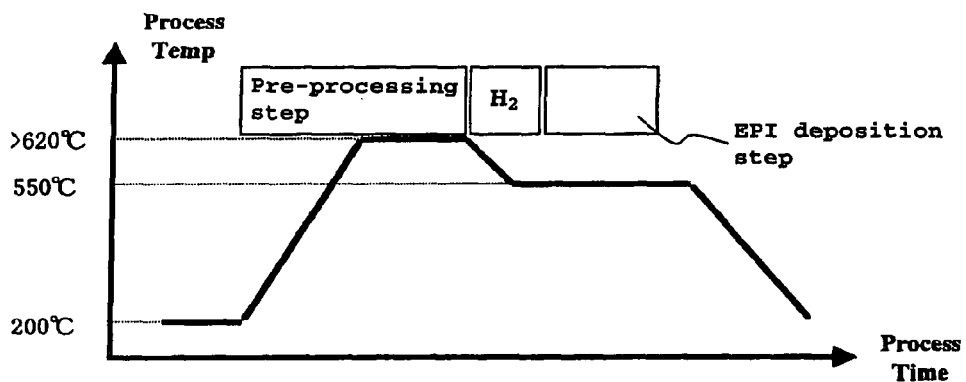

FIG. 6(A) shows a processing sequence when the temperature of an EPI film-forming step is 500 to 750° C., FIG. 6(B) shows a processing sequence when the EPI film-forming step temperature is 620° C. or more, and the EPI-Si film growth during the pre-processing is not preferable, and FIG. 6(C) shows a processing sequence when the EPI film-forming step temperature is 620° C. or less and the EPI-Si film growth during the pre-processing is preferable.

In FIG. 6(A), the wafer 200 is loaded into the processing chamber 201, with the temperature of the inside of the processing chamber 201 set low at 200° C., the inside of the processing chamber 201 is evacuated, and thereafter the temperature is started to be increased toward a prescribed film-forming temperature, and the pre-processing is executed until the temperature is stabilized at an EPI film-forming temperature.

FIG. 6B is a case that the EPI film-forming temperature is higher than 620° C., and EPI film formation during the pre-processing is not preferable. In this case, the pre-processing is started at the temperature increase stage (supply of pre-processing gas is started), and by switching from the pre-processing mixed gas to hydrogen at the time point when a furnace temperature reaches 620° C., the temperature increase and temperature stabilization are performed up to an EPI growth temperature in a hydrogen atmosphere. Thereafter, a prescribed EPI film forming step is performed.

FIG. 6(C) shows a case that the EPI film-forming temperature is lower than 620° C., and the EPI-Si film growth during the pre-processing is preferable, wherein although the pre-processing is started in the temperature increase stage (supply of the pre-processing gas is started), by increasing the temperature of the furnace up to the temperature higher than 620° C. and maintaining this temperature, a prescribed thickness of the buffer layer is obtained, and by switching from the pre-processing mixed gas to hydrogen, temperature is decreased and stabilized to allow a prescribed EPI to grow.

Other Embodiment

Note that explanation has been given to a case of using a vertical type CVD apparatus as shown in FIG. 1 in the aforementioned embodiment. However, the present invention is not limited thereto, and can be applied to a single wafer processing hot wall type or cold wall type apparatus, for example.

Also, in the aforementioned embodiment, explanation has been given to a case that the epitaxial Si film is formed on the substrate. However, the present invention is not limited thereto, and can be applied to a poly-silicon film, an amorphous film, or the epitaxial film, the poly-silicon film, and any one of the elements, B, C, P, GE, As doped epitaxial film, poly-silicon film, and amorphous film.

[Explanation for the Substrate Processing Apparatus to which the Processing Furnace of the Embodiment is Applied]

Next, explanation will be given to the substrate processing apparatus to which the aforementioned processing furnace 202 is applied.

<Apparatus Structure>

Figure 2:
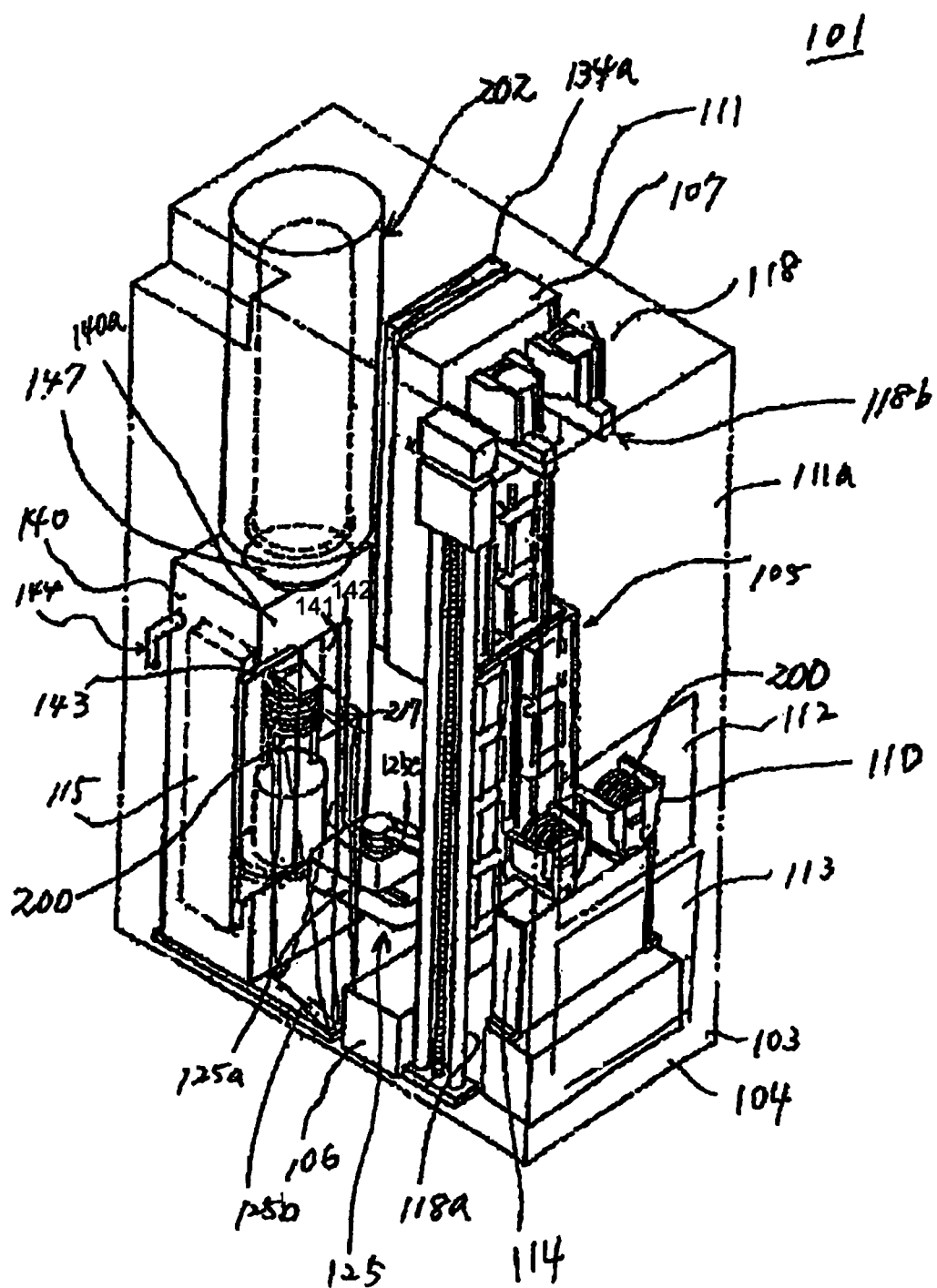
FIG. 2 is an outlined perspective view showing the substrate processing apparatus according to a preferred example of the present invention.

In preferred embodiments for carrying out the present invention, as an example, the substrate processing apparatus is constituted as a semiconductor manufacturing device for executing a processing step in a manufacturing method of the semiconductor device (IC). Note that in the explanation given hereunder, there is given a case that a vertical apparatus (simply called a processing apparatus hereunder) that applies oxidization, diffusion processing and CVD processing to the substrate, as the substrate processing apparatus. FIG. 2 shows an oblique perspective view of the processing apparatus applied to the present invention.

As shown in FIG. 2, a processing apparatus 101 of the present invention using a cassette 110 as a wafer carrier, in which wafers (substrates) 200 composed of silicon, etc, are stored, includes a casing 111. A front face maintenance opening 103 is opened in a lower part of a front face wall 111a of the casing 111 as the opening part, so that maintenance can be performed, and a front face maintenance door 104 for opening and closing this front face maintenance opening 103 is built. A cassette loading/unloading port (substrate container loading/unloading port) 112 is opened in the front face maintenance door 104, so as to be communicated with inside/outside of the casing 111, and a cassette loading/unloading port 112 is opened/closed by a front shutter (substrate container loading/unloading port opening and closing mechanism) 113. A cassette stage (substrate container transfer table) 114 is set in the inside of the casing 111 of the cassette loading/unloading port 112. The cassette 110 is loaded onto the cassette stage 114 by an in-step transfer device (not shown), and is unloaded from the cassette stage 114. The cassette stage 114 is constituted, so that each wafer 200 in the cassette 110 is set in a vertical posture by the in-step transfer device, and a wafer charging/discharging port of the cassette 110 is faced an upper direction Almost at a center lower part in a longitudinal direction within the casing 111, a cassette shelf 105 (a substrate container placement shelf) 105 is set, and a plurality of cassettes 110 are stored in the cassette shelf 105 in multiple stages and multiple rows, so that the wafer 200 in the cassette 110 can be charged and discharged. The cassette shelf 105 is set so as to be laterally moved on a slide stage (a horizontal moving mechanism) 106. In addition, a buffer shelf (a substrate container storage shelf) 107 is set in an upper part of the cassette shelf 105, so that the cassette 110 is stored.

A cassette transfer device (substrate container transfer device) 118 is set between the cassette stage 114 and the cassette shelf 105. The cassette transfer device 118 is constituted of a cassette elevator (substrate container elevation mechanism) 118a capable of elevating the cassette 110 in a state of holding it, and a cassette transfer mechanism (substrate container transfer mechanism) 118b as a transfer mechanism, so that the cassette 110 is transferred among the cassette stage 114, the cassette shelf 105, and the buffer shelf 107, by a continuous operation of the cassette elevator 118a and the cassette transfer mechanism 118b.

A wafer transfer mechanism (substrate transfer mechanism) 125 is set behind the cassette shelf 105, and the wafer transfer mechanism 125 is constituted of a wafer transfer device (substrate transfer device) 125a capable of rotating or moving the wafer 200 straight in a horizontal direction and a wafer transfer device elevator (substrate transfer device elevation mechanism) 125b for elevating the wafer transfer device 125a. As schematically shown in FIG. 2, the wafer transfer device elevator 125b is set at a left side end portion of the casing 111 of withstand pressure. By the continuous operation of these wafer transfer device elevator 125b and the wafer transfer device 125a, charging and discharging of the wafer 200 is performed to the boat (substrate holding tool) 217, with tweezers (substrate holding member) 125c of the wafer transfer device 125a set as a placement part of the wafer 200.

As shown in FIG. 2, a clean unit 134a constituted of a supply fan and a dust-proof filter to supply clean air, being a clean atmosphere, is provided behind the buffer shelf 107, so that the clean air is flown into the casing 111. In addition, a clean unit not shown constituted of the supply fan and the dust-proof filter for supplying the clean air is set at a right side end portion, being an opposite side to the wafer transfer device elevator 125b side. Thus, the clean air blown off from the clean unit is flown through the wafer transfer device 125a, sucked into an exhaust device not shown, and is exhausted to outside of the casing 111.

A casing (referred to as a pressure-withstand casing) 140, which has a sealing performance capable of maintaining a pressure (referred to as a negative pressure hereunder), is set at a backside of the wafer transfer device (substrate transfer device) 125a, and a load lock chamber 141 is formed as a waiting chamber of a load lock type having a capacity capable of containing the boat 217 by this pressure-withstand casing 140.

A wafer loading/unloading port (substrate loading/unloading port) 142 is opened in a front face wall 140a of the pressure-withstand casing 140, and the wafer loading/unloading port 142 is opened/closed by a gate valve (substrate loading/unloading port opening/closing mechanism) 143. A gas supply tube 144 for feeding inert gas such as nitrogen gas to the load lock chamber 141 and an exhaust tube not shown for exhausting the load lock chamber 141 to negative pressure are respectively connected to a pair of side walls of the pressure-withstand casing 140.

The processing furnace 202 is provided in an upper part of the load lock chamber 141. A lower end portion of the processing furnace 202 is opened/closed by a furnace throat valve (furnace throat opening/closing mechanism) 147.

As schematically shown in FIG. 2, a boat elevator (substrate holding tool elevation mechanism) 115 for elevating the boat 217 is set in the load lock chamber 141. The seal cap 219 as a lid member is horizontally installed in an arm not shown, as a holding tool connected to the boat elevator 115, so that the boat 217 is vertically supported by the seal cap 219 to enable the lower end portion of the processing furnace 202 to be closed.

The boat 217 is provided with a plurality of holding members, and a plurality of wafers 200 (about 50 to 150 wafers) are respectively horizontally held in a state of being arranged in a vertical direction, with the center aligned one another.

<Apparatus Operation>

Next, an operation of the processing apparatus of the present invention will be explained.

As shown in FIG. 2, prior to supplying the cassette 110 to the cassette stage 114, the cassette loading/unloading port 112 is opened by a front shutter 113. Thereafter, the cassette 110 is loaded from the cassette loading/unloading port 112, and is placed on the cassette stage 114, so that a wafer charging/discharging port of the cassette 110 faced to an upper direction.

Next, the cassette 110 is rotated at 90° clockwise to a rear side of the casing, so as to be picked up from the cassette stage 114 and the wafer 200 in the cassette 110 is set in a horizontal posture. Subsequently, the cassette 110 is automatically carried and transferred to a designated shelf position of the cassette shelf 105 or the buffer shelf 107, stored therein temporarily, and transferred to the cassette shelf 105 by the cassette transfer device 118 or transferred to the cassette shelf 105 directly.

The slide stage 106 is horizontally moved on the cassette shelf 105, and the cassette 110, being a transfer object, is positioned to confront the wafer transfer device 125a.

When the wafer loading/unloading port 142 of the load lock chamber 141, with an inside set in an atmosphere state, is opened by the operation of the gate valve 143, the wafer 200 is picked up through the wafer charging/discharging port from the cassette 110 by the tweezers 125c of the wafer transfer device 125a and is loaded into the load lock chamber 141 through the wafer loading/unloading port 142, and is transferred and charged to the boat 217 (wafer charging). The wafer transfer device 125a from which the wafer 200 is transferred to the boat 217 is returned to the cassette 110, and charges the next wafer 200 into the boat 217.

When previously designated number of wafers 200 are charged into the boat 217, the wafer loading/unloading port 142 is closed by the gate valve 143, and the load lock chamber 141 is evacuated and a pressure of inside the load lock chamber 141 is reduced. When the pressure in the load lock chamber 414 is reduced to the same pressure as the pressure inside of the processing furnace 202, the lower end portion of the processing furnace 202 is opened by the furnace throat valve 147. Subsequently, the seal cap 219 is elevated by the boat elevator 115, the boat 217 supported by the seal cap 219 is loaded into the processing furnace 202.

After loading, an arbitrary processing is applied to the wafer 200 in the processing furnace 202. After processing, the boat 217 is pulled out by the boat elevator 115, and further the gate valve 143 is opened after the pressure inside of the load lock chamber 141 is restored to atmospheric pressure. Thereafter, the wafer 200 and the cassette 110 are discharged to outside of the casing 111, in a procedure almost opposite to the aforementioned procedure.

Preferred aspects of the present invention will be additionally described.

The present invention provides a manufacturing method of a semiconductor device, comprising:

loading a substrate, with a silicon surface exposed at a part of the substrate, into a processing chamber;

heating an inside of the processing chamber;

performing pre-processing of supplying at least silane-based gas, halogen-based gas, and hydrogen gas into the processing chamber, removing at least a natural oxide film or a contaminated matter that exist on a surface of the silicon surface, and growing an epitaxial film on the silicon surface; and supplying gas containing at least silicon into the processing chamber after pre-processing, and further growing the epitaxial film on the epitaxial film.

Also preferably, the present invention provides the manufacturing method of the semiconductor device, wherein the step of pre-processing further comprises the step of increasing a temperature inside of the processing chamber, and the gas for pre-processing supplied in the step of pre-processing is supplied into the processing chamber in the step of increasing temperature, and is supplied even in a state that a temperature in the processing chamber is 620° C. or more.

Further preferably, the present invention provides the manufacturing method of the semiconductor device, wherein the step of pre-processing further comprises the step of maintaining a temperature in the processing chamber to 620° C. or more and to a desired temperature higher than the temperature in the step of growing the epitaxial film, the gas for pre-processing is supplied into the processing chamber in the step of increasing temperature and the step of maintaining temperature, and after the step of pre-processing ends, the temperature is decreased to the temperature in the step of growing the epitaxial film, while hydrogen gas is supplied into the processing chamber in place of the gas for pre-processing.

Also, the present invention provides a manufacturing method of a semiconductor device, comprising:

loading a substrate, with a silicon surface exposed at a part of the substrate, into a processing chamber;

heating an inside of the processing chamber;

performing pre-processing of supplying at least silane-based gas, halogen-based gas, and hydrogen gas into the processing chamber, and removing at least a natural oxide film or a contaminated matter that exist on a surface of the silicon surface; and supplying gas containing at least silicon into the processing chamber and growing an epitaxial film on the silicon surface that has undergone pre-processing, the pre-processing step further comprising the step of increasing a temperature in the processing chamber, in which the gas for pre-processing supplied in the step of pre-processing is supplied into the processing chamber in the step of increasing temperature until the temperature in the processing chamber reaches 620° C.

Also, preferably the present invention provides the manufacturing method of the semiconductor device, wherein the step of increasing temperature further comprises the step of increasing the temperature up to the temperature of 620° C. or more which is the temperature in the step of growing the epitaxial film, and in the step of increasing the temperature to 620° C. or more, the hydrogen gas is supplied into the processing chamber in place of the gas for pre-processing.

Also, preferably the present invention provides the manufacturing method of the semiconductor device, wherein the substrate loaded into the processing chamber is subjected to cleaning by using dilute hydrofluoric acid, and a hydrogen termination is formed on a surface of the substrate.

Also, preferably the present invention provides the manufacturing method of the semiconductor device, wherein the substrate is loaded into the processing chamber, with the temperature in the processing chamber set at not less than 200° C. and not more than 450 to 500° C., and the gas for pre-processing is supplied into the processing chamber before the temperature in the processing chamber becomes 450 to 500° C.

Also, preferably the present invention provides a substrate processing apparatus, comprising:

a processing chamber that processes a substrate, with a silicon surface exposed at a part of the substrate;

a heating member that heats an inside of the processing chamber;

a supply port that supplies at least silane-based gas, halogen-based gas, hydrogen gas, and gas containing silicon, into the processing chamber;

an exhaust port that exhausts the inside of the processing chamber; and a controller that controls the step of performing pre-processing of supplying at least the silane-based gas, the halogen-based gas, and the hydrogen gas into the processing chamber, removing at least a natural oxide film or a contaminated matter that exists on the surface of the silicon surface, and growing an epitaxial film on the silicon surface, and the step of supplying gas containing at least silicon into the processing chamber after the step of performing pre-processing and further growing the epitaxial film on the epitaxial film.

Also, preferably the present invention provides a substrate processing apparatus, comprising:

a processing chamber that processes the substrate, with a silicon surface exposed at a part of the substrate;

a heating member that heats an inside of the processing chamber;

a supply port that supplies at least silane-based gas, halogen-based gas, hydrogen gas, and gas containing silicon into the processing chamber;

an exhaust port that exhausts the inside of the processing chamber; and a controller that controls steps such as the step of performing pre-processing of supplying at least the silane-based gas, the halogen-based gas, and the hydrogen gas into the processing chamber and removing at least a natural oxide film or a contaminated matter that exists on the surface of the silicon surface, the step of supplying gas containing at least silicon into the processing chamber and growing an epitaxial film on the silicon surface that has undergone pre-processing, and the step of increasing a temperature inside of said processing chamber in said step of performing pre-processing, and the step of supplying the gas for pre-processing supplied in the step of pre-processing into the processing chamber in the step of increasing temperature in which the gas is supplied until the temperature in the processing chamber reaches 620° C.

What is claimed is:

1. A manufacturing method of a semiconductor device, comprising:

loading a substrate, with a silicon surface exposed at a part of the substrate, into a processing chamber;

heating an inside of said processing chamber;

performing pre-processing of supplying a mixed gas of at least silane-based gas, halogen-based gas, and hydrogen gas into said processing chamber, removing at least a natural oxide film or a contaminated matter that exist on a surface of said silicon surface, and growing an epitaxial film on said silicon surface; and supplying gas containing at least silicon into said processing chamber after said pre-processing, and further growing the epitaxial film on said epitaxial film.

2. The manufacturing method of the semiconductor device according to claim 1, wherein said step of pre-processing further comprises the step of increasing a temperature inside of said processing chamber, and said gas for pre-processing supplied in said step of pre-processing is supplied into said processing chamber in said step of increasing temperature, and is supplied even in a state that a temperature in said processing chamber is 620° C. or more.

3. The manufacturing method of the semiconductor device according to claim 2, wherein said step of pre-processing further comprises the step of maintaining a temperature in said processing chamber to 620° C. or more and to a desired temperature higher than the temperature in the step of growing said epitaxial film, said gas for pre-processing is supplied into said processing chamber in said step of increasing temperature and said step of maintaining temperature, and after said step of pre-processing ends, the temperature is decreased to the temperature in the step of growing said epitaxial film, while hydrogen gas is supplied into said processing chamber in place of said gas for pre-processing.

4. A manufacturing method of a semiconductor device, comprising:

loading a substrate, with a silicon surface exposed at a part of the substrate, into a processing chamber;

heating an inside of said processing chamber;

performing pre-processing of supplying a mixed gas of at least silane-based gas, halogen-based gas, and hydrogen gas into said processing chamber, and removing at least a natural oxide film or a contaminated matter that exist on a surface of said silicon surface; and supplying gas containing at least silicon into said processing chamber and growing an epitaxial film on said silicon surface that has undergone said pre-processing, said pre-processing step further comprising the step of increasing a temperature in said processing chamber, in which said gas for pre-processing supplied in said step of pre-processing is supplied into said processing chamber in said step of increasing temperature until the temperature in said processing chamber reaches 620° C.

5. The manufacturing method of the semiconductor device according to claim 4, wherein said step of increasing temperature further comprises the step of increasing the temperature up to the temperature of 620° C. or more which is the temperature in the step of growing said epitaxial film, and in the step of increasing the temperature to 620° C. or more, the hydrogen gas is supplied into said processing chamber in place of said gas for pre-processing.

6. The manufacturing method of the semiconductor device according to claim 1, wherein said substrate loaded into said processing chamber is subjected to cleaning by using dilute hydrofluoric acid, and a hydrogen termination is formed on a surface of said substrate.

7. The manufacturing method of the semiconductor device according to claim 1, wherein said substrate is loaded into said processing chamber, with the temperature in said processing chamber set at not less than 200° C. and not more than 450 to 500° C., and said gas for pre-processing is supplied into said processing chamber before the temperature in said processing chamber becomes 450 to 500° C.

8. A substrate processing apparatus, comprising:

a processing chamber that processes a substrate, with a silicon surface exposed at a part of the substrate;

a heating member that heats an inside of said processing chamber;

a supply port that supplies at least a mixed gas of silane-based gas, halogen-based gas, hydrogen gas, and gas containing silicon, into said processing chamber;

an exhaust port that exhausts the inside of said processing chamber; and a controller that controls the step of performing pre-processing of supplying at least the silane-based gas, the halogen-based gas, and the hydrogen gas into said processing chamber, removing at least a natural oxide film or a contaminated matter that exists on the surface of said silicon surface, and growing an epitaxial film on said silicon surface, and the step of supplying gas containing at least silicon into said processing chamber after said step of performing pre-processing and further growing the epitaxial film on said epitaxial film.

9. A substrate processing apparatus, comprising:

a processing chamber that processes the substrate, with a silicon surface exposed at a part of the substrate;

a heating member that heats an inside of said processing chamber;

a supply port that supplies at least a mixed gas of silane-based gas, halogen-based gas, hydrogen gas, and gas containing silicon into said processing chamber;

an exhaust port that exhausts the inside of said processing chamber; and a controller that controls steps such as the step of performing pre-processing of supplying at least the silane-based gas, the halogen-based gas, and the hydrogen gas into said processing chamber and removing at least a natural oxide film or a contaminated matter that exists on the surface of said silicon surface, the step of supplying gas containing at least silicon into said processing chamber and growing an epitaxial film on said silicon surface that has undergone said pre-processing, and the step of increasing a temperature inside of said processing chamber in said step of performing pre-processing, and the step of supplying said gas for pre-processing supplied in said step of pre-processing into said processing chamber in said step of increasing temperature in which said gas is supplied until the temperature in said processing chamber reaches 620° C.

10. The manufacturing method of the semiconductor device according to claim 4, wherein said substrate loaded into said processing chamber is subjected to cleaning by using dilute hydrofluoric acid, and a hydrogen termination is formed on a surface of said substrate.

11. The manufacturing method of the semiconductor device according to claim 4, wherein said substrate is loaded into said processing chamber, with the temperature in said processing chamber set at not less than 200° C. and not more than 450 to 500° C., and said gas for pre-processing is supplied into said processing chamber before the temperature in said processing chamber becomes 450 to 500° C.

* * * * *